United States Patent
Sasaki et al.

(10) Patent No.: US 8,923,473 B2
(45) Date of Patent: Dec. 30, 2014

(54) SIGNAL PROCESSING CIRCUIT, DRIVER CIRCUIT, AND DISPLAY DEVICE

(75) Inventors: Yasushi Sasaki, Osaka (JP); Yuhichiroh Murakami, Osaka (JP); Etsuo Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 11 days.

(21) Appl. No.: 13/819,827

(22) PCT Filed: Aug. 31, 2011

(86) PCT No.: PCT/JP2011/069820
§ 371 (c)(1),
(2), (4) Date: Feb. 28, 2013

(87) PCT Pub. No.: WO2012/029871
PCT Pub. Date: Mar. 8, 2012

(65) Prior Publication Data
US 2013/0169319 A1   Jul. 4, 2013

(30) Foreign Application Priority Data
Sep. 2, 2010   (JP) ................................. 2010-197200

(51) Int. Cl.
| | | |
|---|---|---|
| G11C 19/00 | (2006.01) | |
| H03K 17/00 | (2006.01) | |
| G09G 3/36 | (2006.01) | |
| G11C 19/18 | (2006.01) | |
| G11C 19/28 | (2006.01) | |
| H03K 19/003 | (2006.01) | |

(52) U.S. Cl.
CPC ............ *H03K 17/005* (2013.01); *G09G 3/3677* (2013.01); *G11C 19/184* (2013.01); *G11C 19/28* (2013.01); *H03K 19/00315* (2013.01); *G09G 2310/0286* (2013.01); *G09G 2310/08* (2013.01)
USPC .................................. 377/64; 377/68; 377/79

(58) Field of Classification Search
None
See application file for complete search history.

(56) References Cited

U.S. PATENT DOCUMENTS

| | | | | |
|---|---|---|---|---|
| 4,849,653 | A | * | 7/1989 | Imai et al. ...................... 327/206 |
| 6,377,099 | B1 | * | 4/2002 | Cairns et al. ................... 327/217 |

(Continued)

FOREIGN PATENT DOCUMENTS

| | | |
|---|---|---|
| JP | 2004-226429 A | 8/2004 |
| JP | 2004-248143 A | 9/2004 |
| JP | 2010-049791 A | 3/2010 |

OTHER PUBLICATIONS

Official Communication issued in International Patent Application No. PCT/JP2011/069820, mailed on Sep. 27, 2011.

*Primary Examiner* — Tuan T Lam
(74) *Attorney, Agent, or Firm* — Keating & Bennett, LLP

(57) ABSTRACT

A signal processing circuit of the present invention includes: a first input terminal; a second input terminal; a third input terminal; a first node; a second node; an output terminal; a resistor; a first signal generating section which (i) is connected to the first node, a third input terminal, and the output terminal and (ii) includes a bootstrap capacitor; and a second signal generating section which is connected to the second node, a first power supply, and the output terminal. The first node becomes active in a case where the first input terminal becomes active. The second node becomes active in a case where the second input terminal becomes active. The output terminal is connected to the first power supply via the resistor. With the configuration, it is possible to have an improvement in operational stability of the signal processing circuit.

2 Claims, 19 Drawing Sheets

(56) References Cited

U.S. PATENT DOCUMENTS

| | | | |
|---|---|---|---|
| 6,928,135 B2 * | 8/2005 | Sasaki et al. | 377/64 |
| 7,215,315 B2 * | 5/2007 | Morosawa et al. | 345/100 |
| 8,107,586 B2 * | 1/2012 | Shin et al. | 377/64 |
| 8,390,560 B2 * | 3/2013 | Toyoshima et al. | 345/100 |
| 2004/0140839 A1 | 7/2004 | Nagao et al. | |
| 2004/0208046 A1 | 10/2004 | Yokozeki | |
| 2007/0248204 A1 * | 10/2007 | Tobita | 377/64 |
| 2008/0072089 A1 * | 3/2008 | Chang et al. | 713/330 |
| 2010/0283524 A1 * | 11/2010 | Kimura | 327/212 |
| 2010/0328259 A1 * | 12/2010 | Ishizaki et al. | 345/174 |
| 2013/0156148 A1 * | 6/2013 | Sasaki et al. | 377/64 |
| 2013/0223584 A1 * | 8/2013 | Umezaki | 377/64 |
| 2013/0301793 A1 * | 11/2013 | Tobita | 377/64 |

\* cited by examiner

SIGNAL PROCESSING CIRCUIT, DRIVER CIRCUIT, AND DISPLAY DEVICE

TECHNICAL FIELD

The present invention relates to a signal processing circuit which is provided in, for example, a driver circuit of a display device.

BACKGROUND ART

Cited Document 1 discloses a configuration of a signal processing circuit constituted by N-channel transistors (see (B) of FIG. 19). The signal processing circuit includes a bootstrap circuit. In a case where a signal supplied to a terminal 2 becomes active (High), a signal (clock signal or power supply signal) supplied to a terminal 1 is outputted from a terminal 4 (output terminal) (because of a bootstrap effect, the signal processing circuit can output a signal which is not less than a threshold). In a case where a signal supplied to a terminal 3 becomes active (High), a VSS (Low) is outputted from the terminal 4 (output terminal).

CITATION LIST

Patent Literature

Patent Literature 1
Japanese Patent Application Publication, Tokukai, No. 2010-49791 A (Publication Date: Mar. 4, 2010)

SUMMARY OF INVENTION

Technical Problem

However, the above-mentioned signal processing circuit has a problem that, in a case where both of the terminal 2 and the terminal 3 become inactive (Low), the terminal 4 (output terminal) becomes in an electrically-floating state, and, as a result, an operation of the signal processing circuit becomes unstable.

An object of the present invention is to provide a signal processing circuit having high operational stability.

Solution to Problem

A signal processing circuit includes a first input terminal; a second input terminal; a third input terminal; a first node; a second node; an output terminal; a resistor; a first signal generating section which (i) is connected to the first node, the third input terminal, and the output terminal and (ii) includes a bootstrap capacitor; and a second signal generating section which is connected to the second node, a first power supply (a power supply corresponding to a potential of the input terminal which is inactive), and the output terminal, the first node becoming active in a case where the first input terminal becomes active, the second node becoming active in a case where the second input terminal becomes active, the output terminal being connected to the first power supply via the resistor.

According to the signal processing circuit of the present invention, the output terminal is connected to the first power supply via the resistor. For this reason, even in a case where the first node and the second node become inactive, the output terminal does not become in an electrically-floating state. Accordingly, it is possible for the signal processing circuit to have an improvement in operational stability.

Advantageous Effects of Invention

As described above, according to the present invention, it is possible to provide a signal processing circuit having high operational stability.

DESCRIPTION OF EMBODIMENTS

One embodiment of the present invention is described below with reference to FIGS. 1 through 18.

Figure 3:
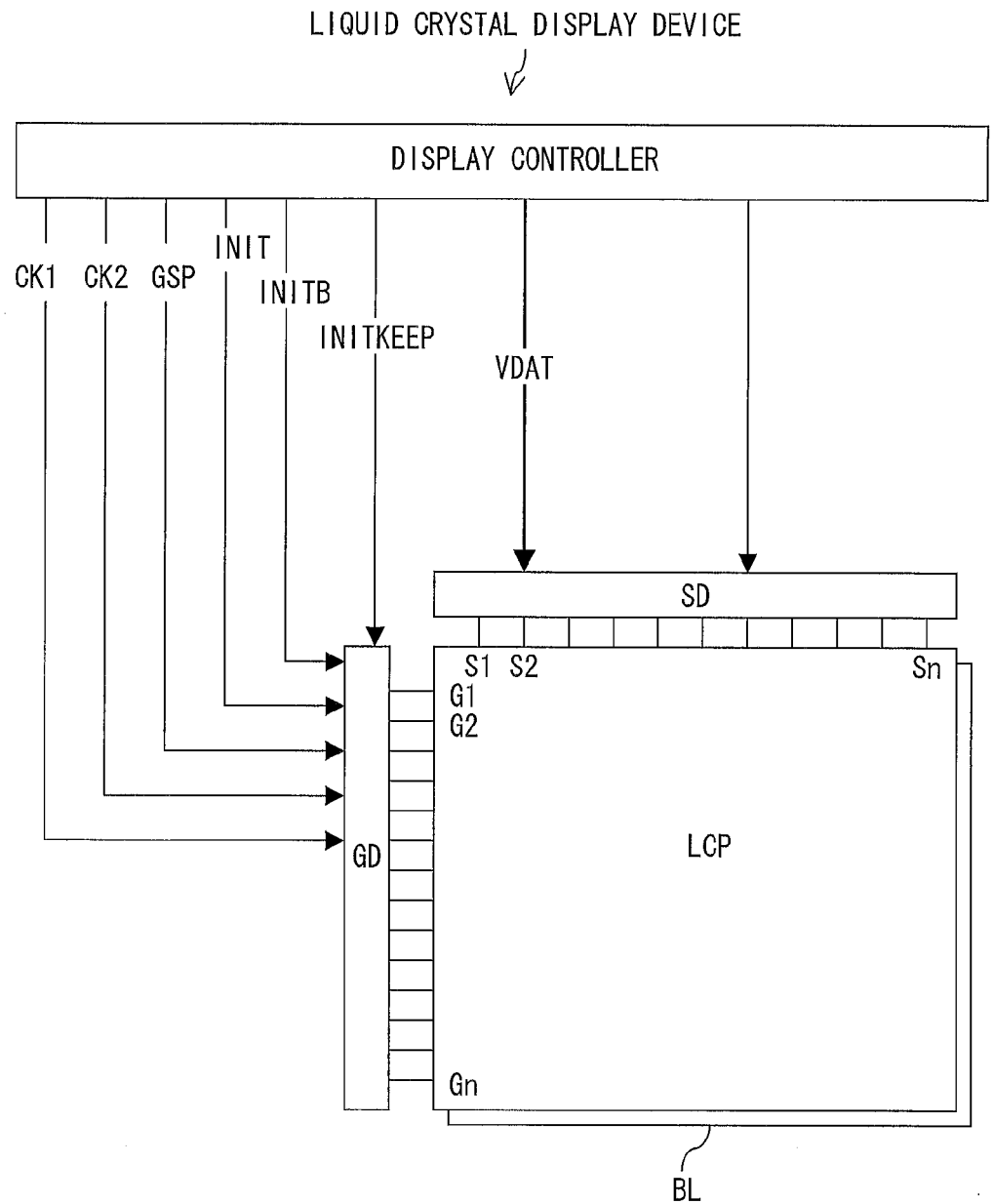
FIG. 3 is a block diagram illustrating a configuration of a liquid crystal display device of the present invention.

FIG. 3 illustrates a configuration example of a liquid crystal display device including a flip-flop of the present invention. The liquid crystal display device illustrated in FIG. 3 includes a display controller, a gate driver GD, a source driver SD, a liquid crystal panel LCP, and a backlight BL (which is necessary only in a case where the liquid crystal display device is of a light transmissive type). The display controller controls the gate driver GD and the source driver SD. The display controller supplies, to the gate driver GD, (i) a first clock signal (CK1 signal), (ii) a second clock signal (CK2 signal), (iii) a gate start pulse signal (GSP signal), (iv) a first initialization signal (INIT signal), (v) a second initialization signal (INITB signal), and (vi) a third initialization signal (INITKEEP signal), for example. The gate driver GD drives scanning signal lines G1 through Gn of the liquid crystal panel LCP, and the source driver SD drives data signal lines S1 through Sn of the liquid crystal panel LCP. The gate driver GD and the source driver SD can be monolithically formed with the liquid crystal panel LCP.

Figure 4:
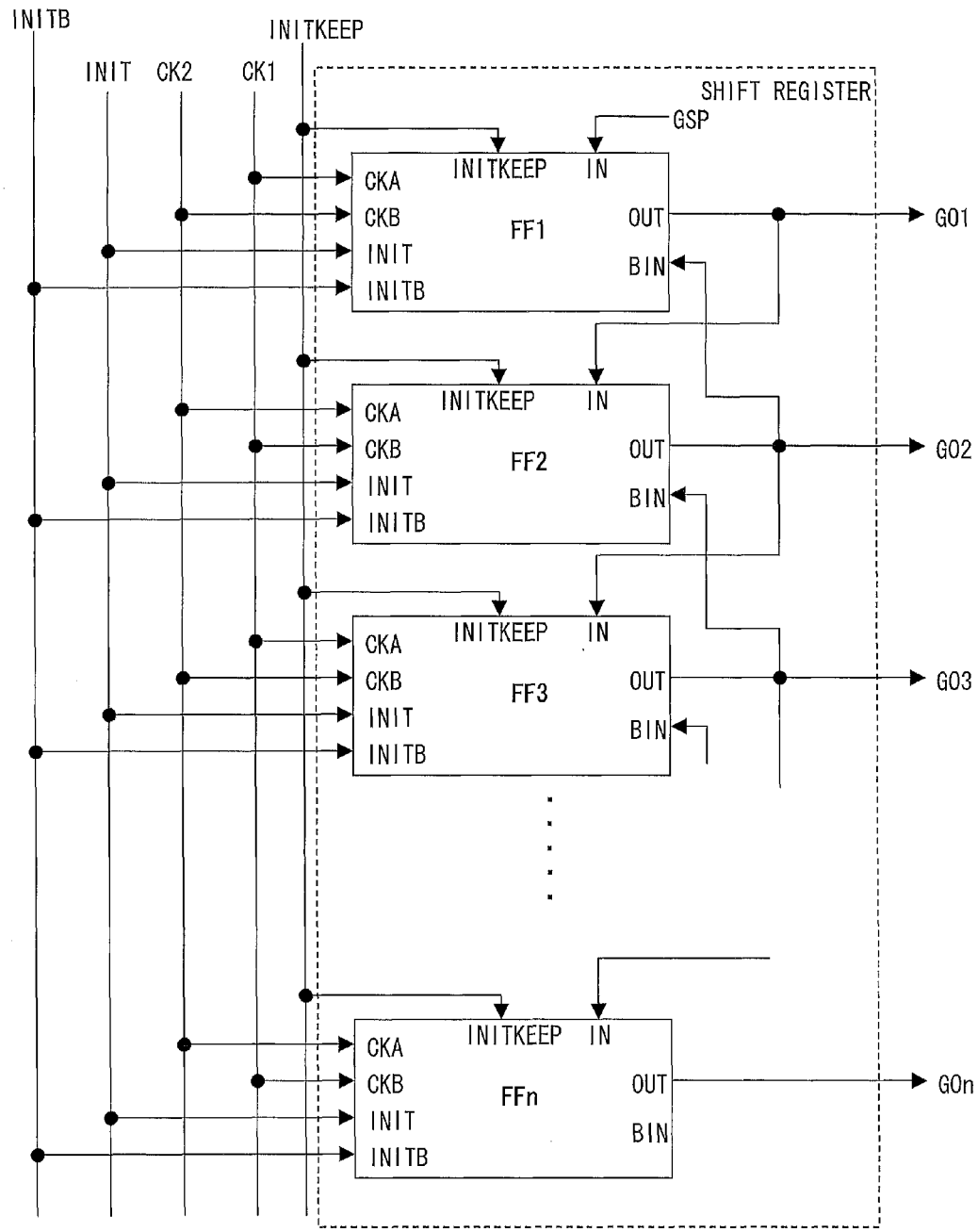
FIG. 4 is a circuit diagram illustrating a configuration example of a shift register of the present invention.

The gate driver GD includes a shift register illustrated in FIG. 4. The shift register illustrated in FIG. 4 includes a plurality of flip-flops connected to each other in series. Each of the plurality of flip-flops includes an input terminal (IN terminal), an output terminal (OUT terminal), a first clock signal terminal (first control signal terminal) CKA, a second clock signal terminal (second control signal terminal) CKB, a first initialization terminal (INIT terminal), a second initialization terminal (INITB terminal), a third initialization terminal (INITKEEP terminal), and a back-in terminal (BIN terminal).

Here, each of flip-flops (for example, FF1 and FF3) provided in odd stages is such that its CKA terminal receives a CK1 signal and its CKB terminal receives a CK2 signal. Meanwhile, each of flip-flops (for example, FF2 and FFn) provided in even stages is such that its CKA terminal receives a CK2 signal and its CKB terminal receives a CK1 signal. Further, flip-flops (FF1 through FFn) provided in all of the stages receive an INIT signal, an INITB signal, and an INITKEEP signal. Moreover, each of the flip-flops provided in all of the stages is such that its IN terminal is connected to an OUT terminal of a flip-flop provided in a preceding stage, and its BIN terminal is connected to an OUT terminal of a flip-flop provided in a subsequent stage. Note that the CK1 signal and the CK2 signal are such clock signals that an active time period (high time period) of the CK1 signal and an active time period (high time period) of the CK2 signal do not overlap each other.

Figure 2:
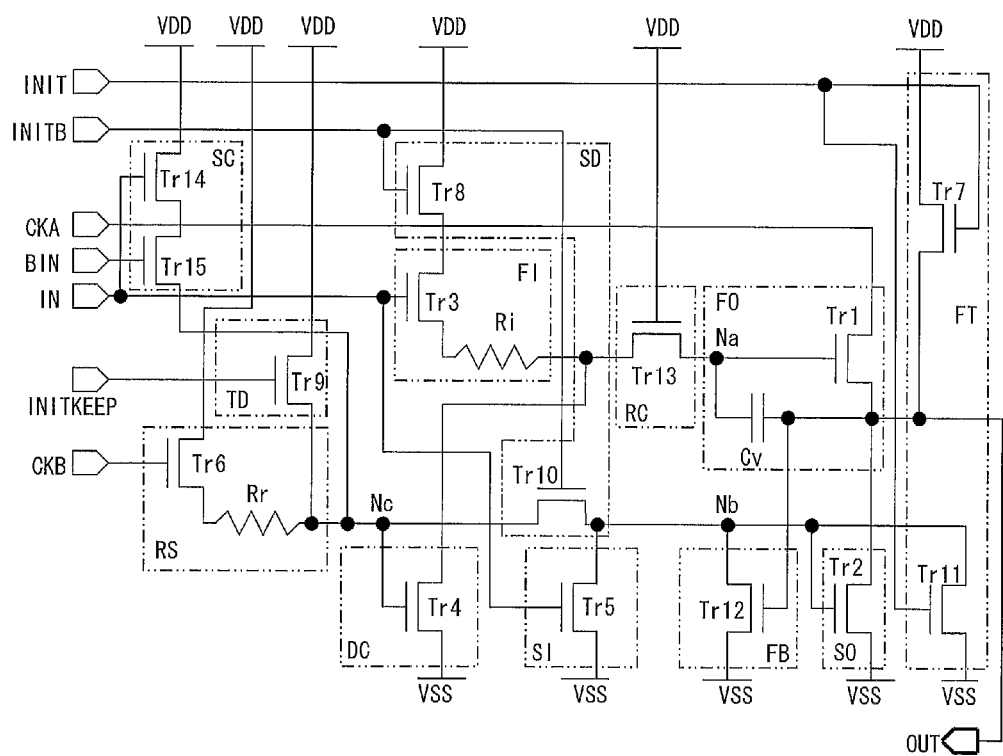
FIG. 2 is a circuit diagram illustrating a configuration of a flip-flop.

The flip-flop of the present invention is used in each of the stages of the shift register illustrated in FIG. 4. FIG. 2 illustrates a configuration example of the flip-flop of the present invention. The flip-flop illustrated in FIG. 2 includes (i) an IN terminal, (ii) an OUT terminal, (iii) a CKA terminal, (iv) a CKB terminal, (v) a first output section FO which (a) includes a bootstrap capacitor Cv and (b) is connected to the CKA terminal and the OUT terminal, (vi) a second output section SO which is connected to a first power supply VSS (low-potential-side power supply) and the OUT terminal, (vii) a first input section FI which (a) is connected to the IN terminal and a second power supply VDD (high-potential-side power supply) and (b) charges the bootstrap capacitor Cv, (viii) a discharge section DC which discharges the bootstrap capacitor Cv, (ix) a second input section SI which is connected to (a) the IN terminal, (b) the first power supply VSS, and (c) the second output section, (x) a reset section RS which (a) is connected to the CKB terminal and (b) controls the discharge section DC and the second output section SO, (xi) a first initialization section FT which controls the first output section FO, (xii) a second initialization section SD which controls the first input section FI, (xiii) a third initialization section TD which controls the discharge section DC and the second output section SO, (xiv) a feedback section FB which (a) is connected to the OUT terminal and (b) controls the second output section SO, (xv) a relay section RC which is provided between the first input section FI and the first output section FO so that the first input section FI and the first output section FO are electrically connected to each other via the relay circuit RC, and (xvi) a malfunction preventing section SC which prevents such a case that during a normal operation, a flip-flop in which the malfunction preventing section SC is provided and a flip-flop provided in another stage become simultaneously active.

More specifically, the flip-flop of the present invention is such that (i) the first output section FO is constituted by a transistor Tr1 (first transistor) and the bootstrap capacitor Cv, (ii) the second output section SO is constituted by a second transistor Tr2 (second transistor), (iii) the first input section FI is constituted by a transistor Tr3 (third transistor) and a resistor Ri, (iv) the discharge section DC is constituted by a transistor Tr4 (fourth transistor), (v) the second input section SI is constituted by a transistor Tr5 (fifth transistor), (vi) the reset section RS is constituted by a transistor Tr6 (sixth transistor) and a resistor Rr, (vii) the first initialization section FT is constituted by a transistor Tr7 (seventh transistor) and a transistor Tr11 (eleventh transistor), (viii) the second initialization section is constituted by a transistor Tr8 (eighth transistor) and a transistor Tr10 (tenth transistor), (ix) the third initialization section is constituted by a transistor Tr9 (ninth transistor), (x) the feedback section FB is constituted by a transistor Tr12 (twelfth transistor), (xi) the relay section RC is constituted by a transistor Tr13 (thirteenth transistor), and (xii) the malfunction preventing section SC is constituted by transistors Tr14 and Tr15. Note that all of the transistors Tr1 through Tr15 are identical with each other in conductivity type (N-channel type).

Further, the Tr1 is such that (i) its drain electrode is connected to the CKA terminal, (ii) its gate electrode and its source electrode are connected to each other via the bootstrap capacitor Cv, and (iii) its source electrode (a) is connected to the OUT terminal and (b) is also connected to the VSS via the Tr2.

Moreover, gate terminals of the Tr3, the Tr5, and the Tr14 are connected to the IN terminal. A gate terminal of the Tr6 is connected to the CKB terminal. Gate terminals of the Tr7 and the Tr11 are connected to the INIT terminal. Gate terminals of the Tr8 and the Tr10 are connected to the INITB terminal. A gate terminal of the Tr9 is connected to the INITKEEP terminal. A gate terminal of the Tr13 is connected to the VDD. A gate terminal of the Tr15 is connected to the BIN terminal.

Further, a first node Na is connected to (i) the gate terminal of the Tr1, (ii) one of ends of the resistor Ri via the Tr13, and (iii) the VSS via the Tr4. The other one of ends of the resistor Ri is connected to the VDD via the Tr3 and the Tr8 (the Tr3 is provided on a resistor Ri side, and the Tr8 is provided on a VDD side).

Moreover, a second node Nb is connected to (i) a gate terminal of the Tr2, (ii) the VSS via the Tr5, (iii) the VSS via the Tr11, and (iv) the VSS via the Tr12. Further, a third node Nc is connected to (i) a gate terminal of the Tr4, (ii) the VDD via the Tr9, and (iii) the VDD via the resistor Rr and the Tr6 (the resistor Rr is provided on a third node Nc side, and the Tr6 is provided on the VDD side). The second node Nb and the third node Nc are connected to each other via the Tr10. Furthermore, the third node Nc is connected to the VDD via the Tr15 and the Tr14 (the Tr15 is provided on the third node Nc side, and the Tr14 is provided on the VDD side).

Figure 5:
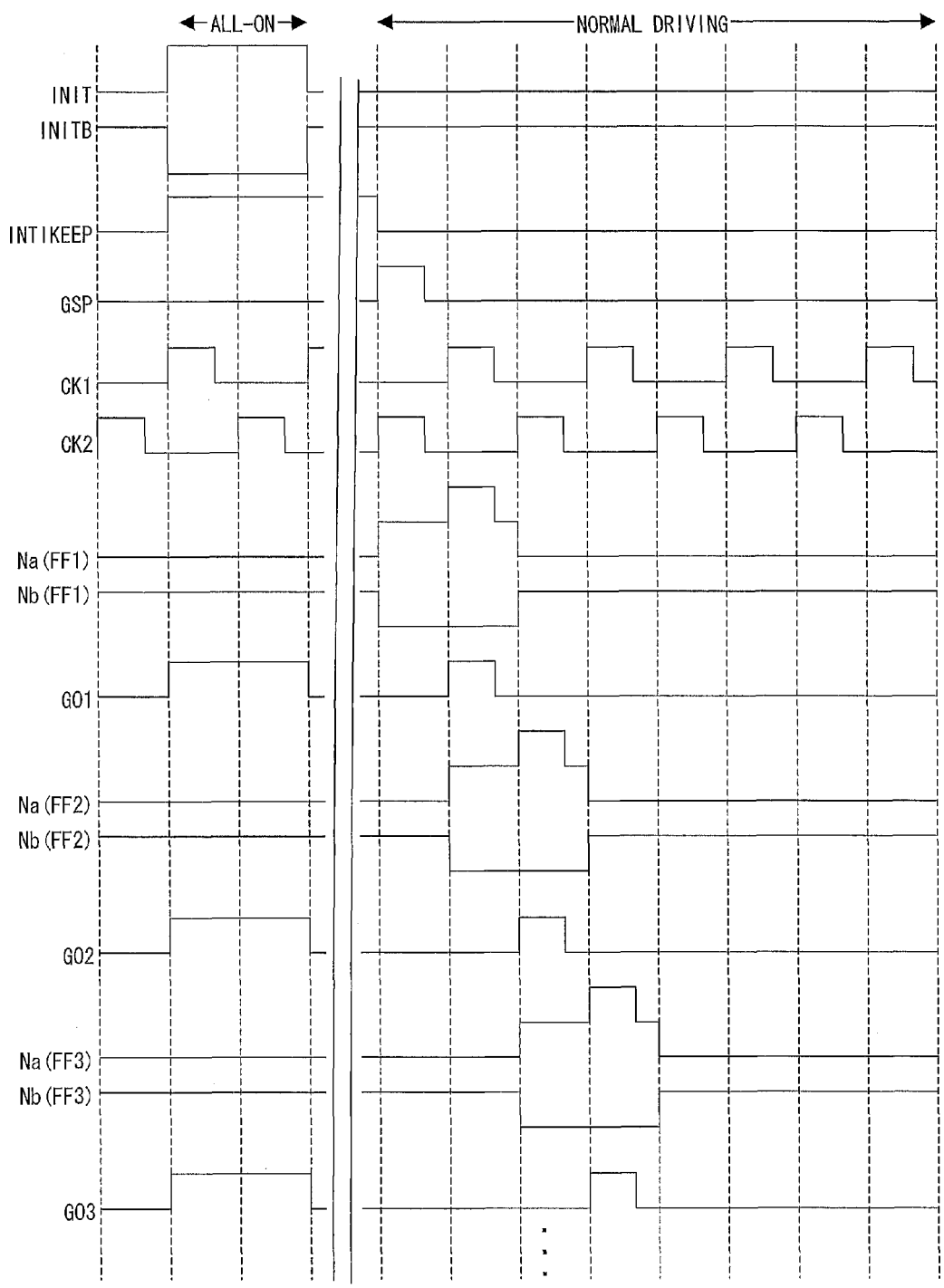
FIG. 5 is a timing chart showing an operation of the shift register illustrated in FIG. 3.

FIG. 5 shows an operation of the shift register of the present invention. In an all-on time period, the INIT signal becomes active (High), the INITB signal becomes active (Low), and the INITKEEP signal becomes active (High). Accordingly, the bootstrap capacitor Cv is discharged by the discharge section DC. It follows that (i) the first output section FO becomes inactive (because the Tr9 and the Tr4 are turned on, and the Tr1 is turned off), and simultaneously (ii) the second output section SO becomes inactive (because the Tr11 is turned on, and the Tr2 is turned off). Accordingly, a source electrode of the Tr1 of the first output section FO is electrically connected to the VDD via the first initialization section FT. A potential of VDD (High) is therefore successfully supplied to the OUT terminal, irrespective of the CK1 signal and the CK2 signal. With the configuration of the present invention, the second node becomes the VSS during the all-on time period and the third node becomes the VDD during the all-on time period. Accordingly, the Tr10 is turned off by use of the INITB signal so as to cause the second node and the third node to be electrically disconnected during the all-on time period. Meanwhile, during a time period from a time that the all-on time period is finished to a time that the GSP signal becomes active, the INIT signal becomes inactive (Low), the INITB signal becomes inactive (High), and the INITKEEP signal becomes active (High). It follows that the Tr10 is turned on, and the second output section SO becomes active (the Tr2 is turned on). A potential of VSS (Low) is therefore successfully supplied to the OUT terminal, irrespective of the CK1 signal and the CK2 signal.

The following description deals with an operation of the shift register of the present invention during a time period in which normal driving is carried out. During the time period in which the normal driving is carried out, the INIT signal becomes inactive (Low), the INITB signal becomes inactive (High), and the INITKEEP signal becomes inactive (Low). Note that the INITKEEP signal becomes inactive (Low) (the Tr8 and the Tr10 are turned on, and the Tr7 and the Tr9 are turned off) in synchronization with activation of the GSP signal.

For example, in a case where the IN terminal of the flip-flop FF1 (see FIG. 4) provided in a first stage becomes active (the GSP signal becomes active), the bootstrap capacitor Cv is charged. As a result, a potential of the first node Na is precharged to be approximately "VDD–Vth" (where Vth is a threshold voltage of the transistor). Here, since the CK2 is High (the CKB terminal is active), both of the Tr5 and the Tr6 are turned on. Since the resistor Rr limits a current, a drive capability of the Tr5 becomes higher than that of the Tr6. Accordingly, the second node Nb has a potential of VSS. The second node Nb maintains the potential of VSS, even in a case where the GSP signal becomes inactive (this is because the Tr2, the Tr12, and the Tr4 keep being in the off state).

Here, in a case where the CK1 signal is raised, a potential of the first node Na is boosted to be not less than a potential of VDD by a bootstrap effect. Accordingly, the CK1 signal (High) is outputted from the OUT terminal (GO1) without having a reduction in potential (i.e., without the potential being less than a threshold). In a case where the OUT terminal becomes High, the Tr12 of the feedback section FB is turned on. This makes sure that the second node Nb has a potential of VSS. In a case where the CK1 is dropped, the bootstrap effect is nullified and the potential of the first node Na returns to a potential of "VDD–Vth". Then, in a case where the CK2 is raised, (i) the Tr4 of the discharge section is turned on and the bootstrap capacitor Cv is discharged, and, simultaneously, (ii) the Tr2 is turned on and the VSS (Low) is outputted from the OUT terminal (GO1). A reset operation (self-reset operation) of the flip-flop FF1 is thus completed.

Figure 6:
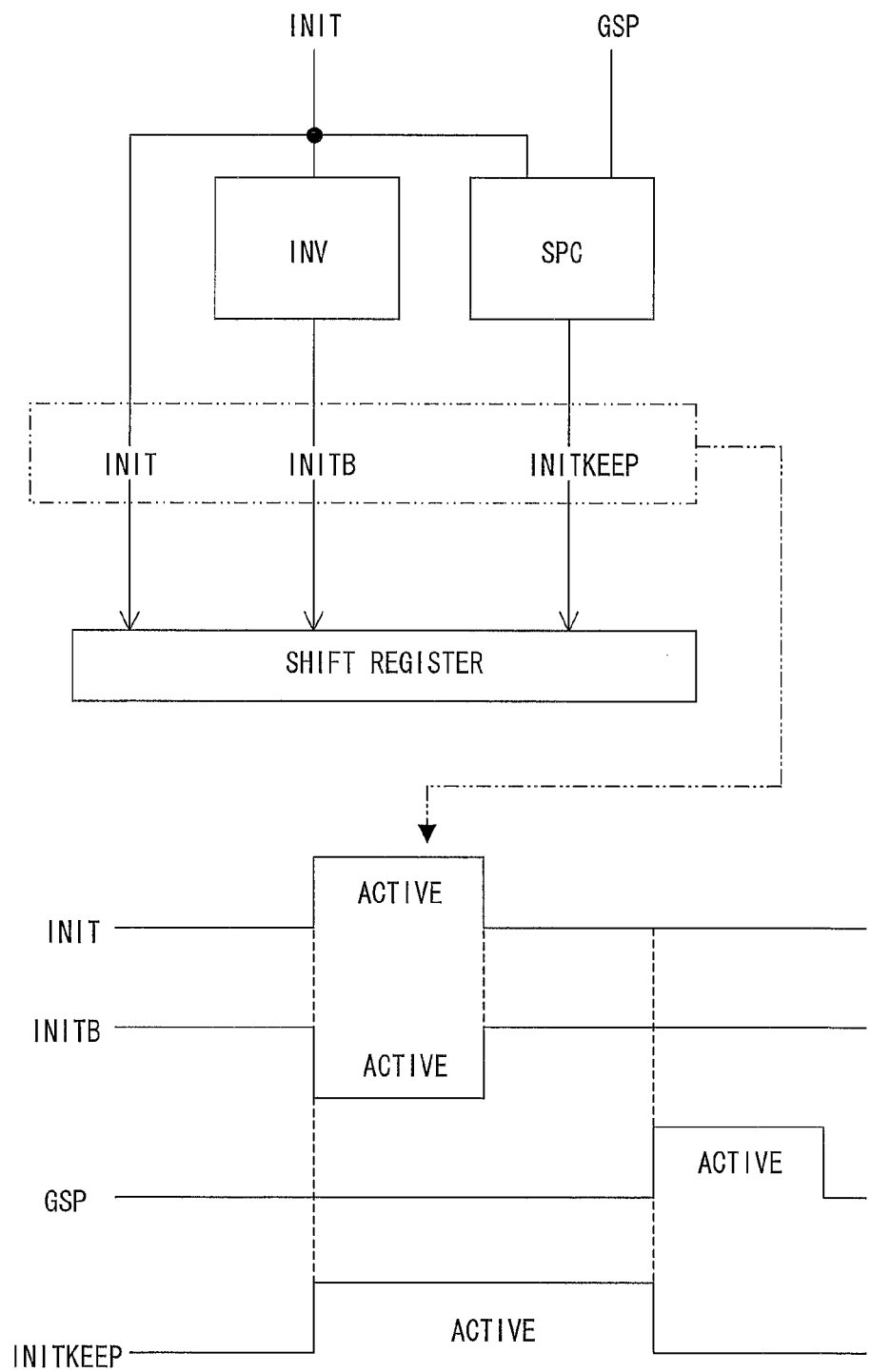
FIG. 6 is an explanatory diagram illustrating a first initialization signal, a second initialization signal, and a third initialization signal.

Moreover, the configuration illustrated in FIG. 2 includes a malfunction preventing section SC. For this reason, in a case where, during the time period in which the normal operation is carried out, both an output of a flip-flop provided in a preceding stage (one stage before the stage of the flip-flop) and an output of a flip-flop provided in a subsequent stage (one stage after the stage of the flip-flop) become active, both the Tr14 and the Tr15 are turned on, and as a result, the Tr2 is turned on. This makes it possible to cause forcibly the OUT terminal to have a potential of VSS (Low). Further, the configuration illustrated in FIG. 2 includes the relay circuit RC (Tr13). For this reason, in a case where the potential of the first node Na becomes not less than a certain value, the Tr13 is turned off due to the bootstrap effect. This makes it possible to protect the Tr4 of the discharge section DC from a high voltage The INITB signal, which is an inversion signal of the INIT signal, and the INITKEEP signal are generated on the basis of the INIT signal. That is, as illustrated in FIG. 6, (i) an inverter circuit INV receives the INIT signal and outputs the INTB signal on the basis of the INIT signal, and (ii) a signal processing circuit SPC receives the INIT signal and generates an INITKEEP signal on the basis of the INIT signal. Here, the INITB signal is an inversion signal of the INIT signal, and the INITKEEP signal is active (High) at timing when the INIT signal changes from the active (High) state to the inactive (Low) state, and, after such timing, becomes inactive (Low) (e.g., in synchronization with activation of the GSP signal, as shown in FIG. 5).

Figure 7:
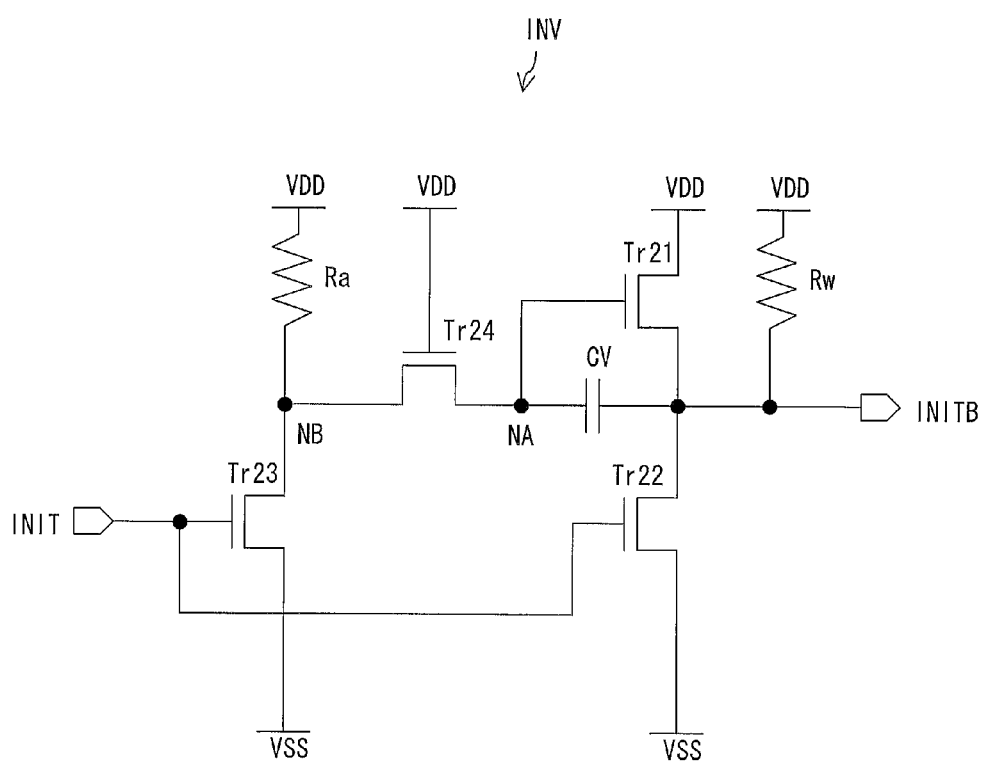
FIG. 7 is a circuit diagram illustrating an inverter circuit used in a driver of a liquid crystal display device of the present invention.

FIG. 7 is a circuit diagram illustrating a configuration of the inverter circuit INV. The inverter circuit INV includes N-channel transistors Tr21 through Tr24, resistors Ra and Rw, a bootstrap capacitor CV, an IN terminal, and an OUT terminal (see FIG. 7).

The Tr21 is such that (i) its gate electrode and its source electrode are connected to each other via the bootstrap capacitor CV, (ii) its drain electrode is connected to the VDD, and (iii) its source electrode is connected to the OUT terminal. A gate electrode of the Tr22 and a gate electrode of the Tr23 are connected to the IN terminal. A gate electrode of the Tr24 is connected to the VDD. A node NA connected to the gate electrode of the Tr21 is connected to a node NB via the Tr24. The node NB is connected to (i) the VDD via the resistor Ra and (ii) the VSS via the Tr23. The OUT terminal is connected to (i) the VDD via the resistor Rw and (ii) the VSS via the Tr22.

In a case where the IN terminal of the inverter circuit INV illustrated in FIG. 7 becomes active (High), both the node NA and the node NB have a potential of VSS (Low). As a result, the Tr21 is turned off and the Tr22 is turned on. Accordingly, the OUT terminal receives a potential of VSS (Low). In this state, in a case where the IN terminal becomes inactive (Low), the bootstrap capacitor CV is charged by the VDD via the resistor Ra (this causes the Tr24 to be turned off). As a result, a current flows through the Tr21. This causes the node NA to be boosted via the bootstrap capacitor CV. The OUT terminal therefore outputs a potential of VDD (High) without having a reduction in potential (without the potential being less than a threshold). The inverter circuit INV illustrated in FIG. 7 has an arrangement in which the OUT terminal is connected to the VDD via the resistor Rw. With the arrangement, the OUT terminal can continue outputting a potential of VDD (without the potential being less than a threshold), even after the bootstrap effect is nullified. Further, the configuration illustrated in FIG. 7 includes the Tr24. In a case where the node NA has a high potential due to the bootstrap effect, the Tr24 is turned off. Accordingly, it is possible to prevent the Tr23 from being damaged or deteriorated due to a high potential generated in the node NA.

Figure 1:
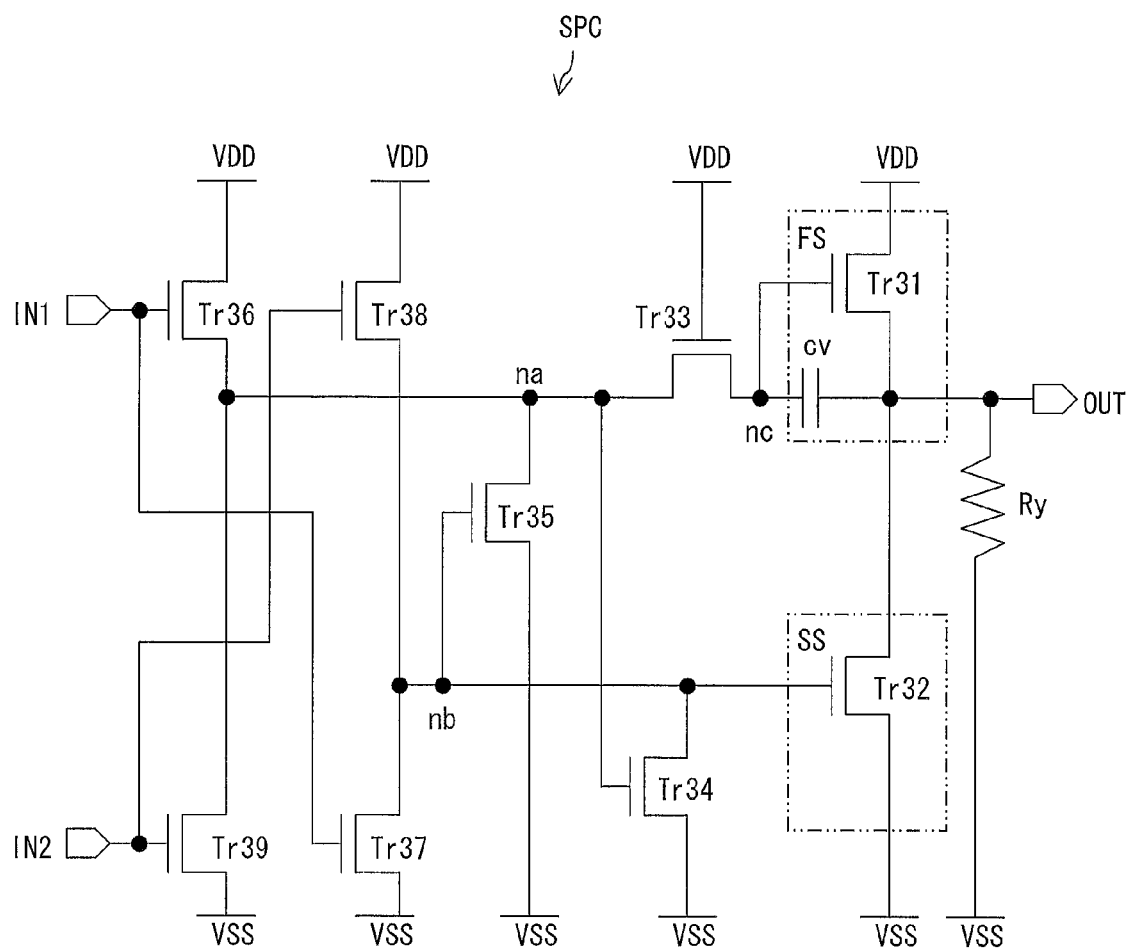
FIG. 1 is a circuit diagram illustrating a configuration of a signal processing circuit of the present invention.

FIG. 1 illustrates a configuration example of the signal processing circuit SPC. The signal processing circuit SPC illustrated in FIG. 1 includes (i) an IN1 terminal (first input terminal), (ii) an IN2 (second input terminal), (iii) an OUT terminal (output terminal), (iv) a node na (first node), (v) a node nb (second node), (vi) a first signal generating section FS which (a) is connected to the VDD (first power supply) and the OUT terminal and (b) includes a bootstrap capacitor cv, and (vii) a second signal generating section SS which is connected to the node nb, the VSS (second power supply), and the OUT terminal. In a case where the IN1 terminal becomes active, the node na becomes active (High). In a case where the IN2 becomes active, the node nb becomes active (High). The OUT terminal is connected to the VSS via a resistor Ry.

Specifically, the signal processing circuit SPC includes (i) a transistor Tr31 constituting the first signal generating section FS, (ii) a transistor Tr32 constituting the second signal generating section SS, and (iii) transistors Tr33 through Tr39. Here, the Tr31 is such that (i) its drain electrode is connected to the VDD, (ii) its source electrode and its gate electrode are connected to each other via the bootstrap capacitor cv, and (iii) its source electrode is connected to the OUT terminal. The source electrode of the Tr31 is connected to (i) the VSS via the resistor Ry and (ii) the VSS via the Tr32. Moreover, gate electrodes of the Tr32 and the Tr35 are connected to the node nb. A gate electrode of the Tr34 is connected to the node na. Gate electrodes of the Tr36 and the Tr37 are connected to the IN1 terminal. Gate electrodes of the Tr38 and the Tr39 are connected to the IN2 terminal. Further, a node nc is connected to (i) the gate electrode of the Tr31 and (ii) the node na via the Tr33. The node na and the VSS are connected to each other via the Tr35. The node nb and the VSS are connected to each other via the Tr34. The node na and the VDD are connected to each other via the Tr36, and the node na and the VSS are connected to each other via the Tr39. The node nb and the VDD are connected to each other via the Tr38, and the node nb and the VSS are connected to each other via the Tr37.

With the signal processing circuit SPC illustrated in FIG. 1, in a case where the IN2 terminal becomes inactive (Low) and the IN1 terminal becomes active (High), the node na becomes active (High) and the node nb becomes inactive (Low) (the Tr36 and the Tr37 are turned on). As a result, the bootstrap capacitor cv is charged and a current flows through the Tr31. This causes the node nc to be boosted via the bootstrap capacitor cv, and the OUT terminal outputs a potential of VDD (High) without a reduction in potential (without the potential being less than a threshold). Then, in a case where the IN1 terminal becomes inactive (Low) (while the IN2 terminal remains inactive), the nodes nc and nb become in an electrically-floating state. The OUT terminal therefore continues outputting a potential of VDD (High). Then, in a case where the IN2 terminal becomes active (High), (i) the node nb becomes active (High) and (ii) the node na becomes inactive (Low) (the Tr38, the Tr39, and the Tr32 are turned on). It follows that the OUT terminal outputs a potential of VSS (Low). Accordingly, in the case illustrated in FIG. 6, it is possible to cause the OUT terminal to receive the INITKEEP signal shown in FIG. 6 by (i) supplying the INIT signal to the IN1 terminal and (ii) supplying the GSP signal to the IN2 terminal.

Here, by setting the resistor Ry to have a high resistance, i.e., in a range of 0.5 megohm to 5.5 megohm, it is possible to determine, with the use of the resistor Ry, an initial value (a potential which the source electrode of the Tr31 has, before the IN1 terminal becomes active) of the OUT terminal. With the arrangement, the bootstrap circuit of the first signal generating section FS functions properly in a case where the IN1 terminal becomes active (High).

Moreover, the signal processing circuit SPC illustrated in FIG. 1 includes the transistors Tr34 and Tr35. With the arrangement, it is possible to (i) cause the node nb to have a potential of VSS (inactive) successfully during a time period in which the node na is active and (ii) cause the node na to have a potential of VSS (inactive) during a time period in which the node nb is active. This makes it possible to maintain successfully a preceding output (High in FIG. 6) during a time period in which the IN1 and the IN2 become inactive (in FIG. 6, a time period from a time that the INIT signal becomes inactive to a time that the GSP signal becomes active).

Further, it is preferable that the IN1 and the IN2 are inactive at timing when the signal processing circuit SPC illustrated in FIG. 1 is initially started to be in operation. This allows the bootstrap circuit of the first signal generating section FS to function more successfully.

The signal processing circuit SPC illustrated in FIG. 1 includes the Tr33. With the arrangement, in a case where a potential of the node nc becomes not less than a certain value due to the bootstrap effect, the Tr33 is turned off. This makes it possible to protect, from a high voltage, each of the transistors (Tr34, Tr35, Tr36, and Tr39) connected to the node na.

Figure 8:
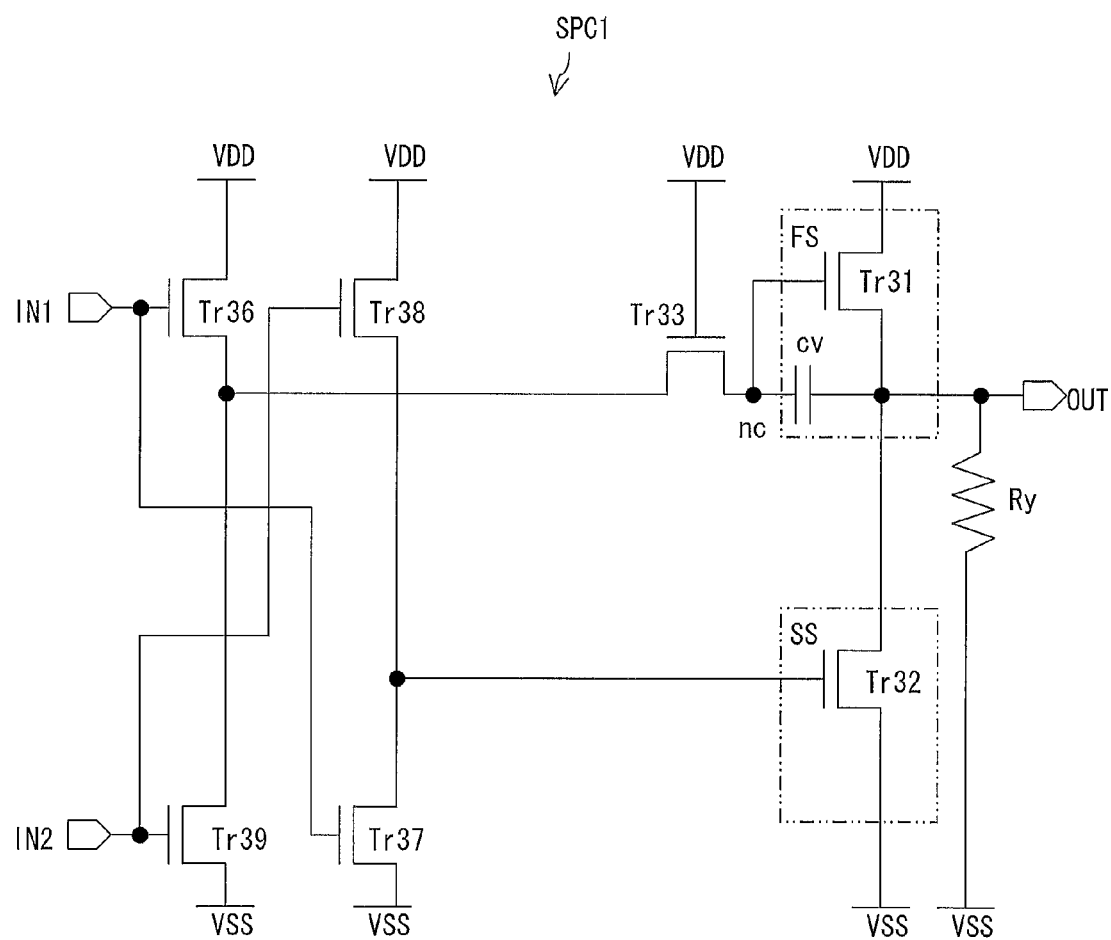
FIG. 8 is a view illustrating a modified example of the signal processing circuit illustrated in FIG. 1.
Figure 9:
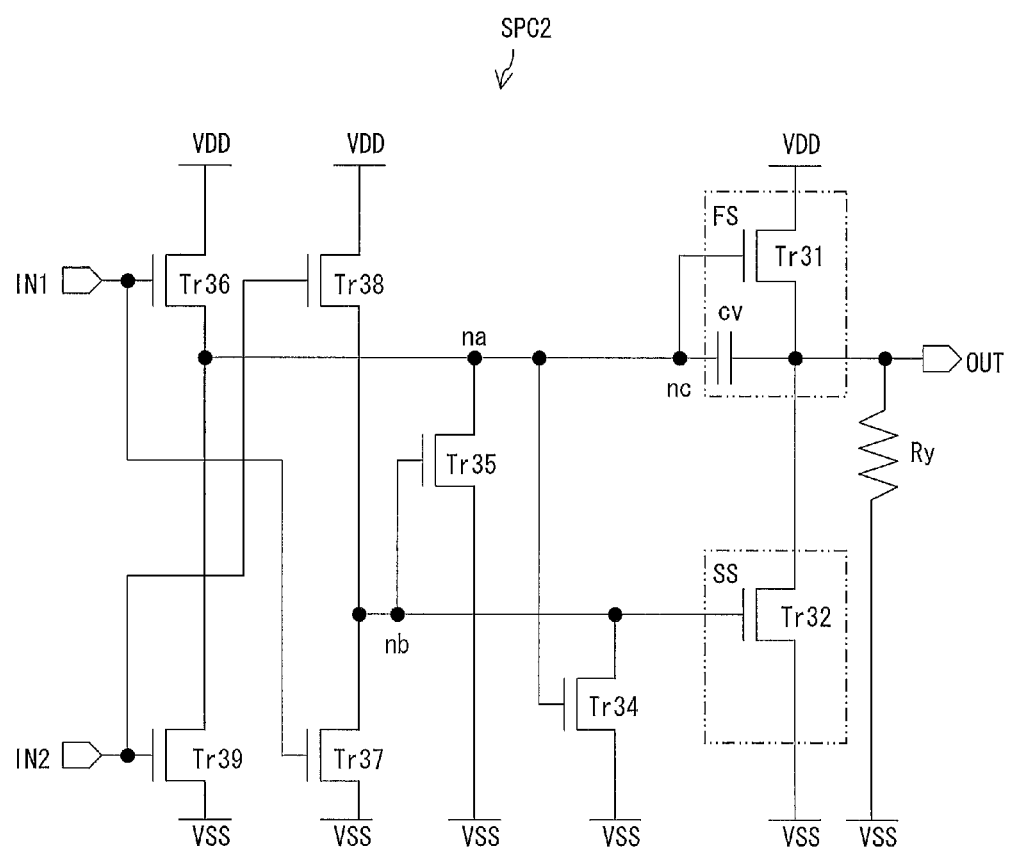
FIG. 9 is a view illustrating another modified example of the signal processing circuit illustrated in FIG. 1.
Figure 10:
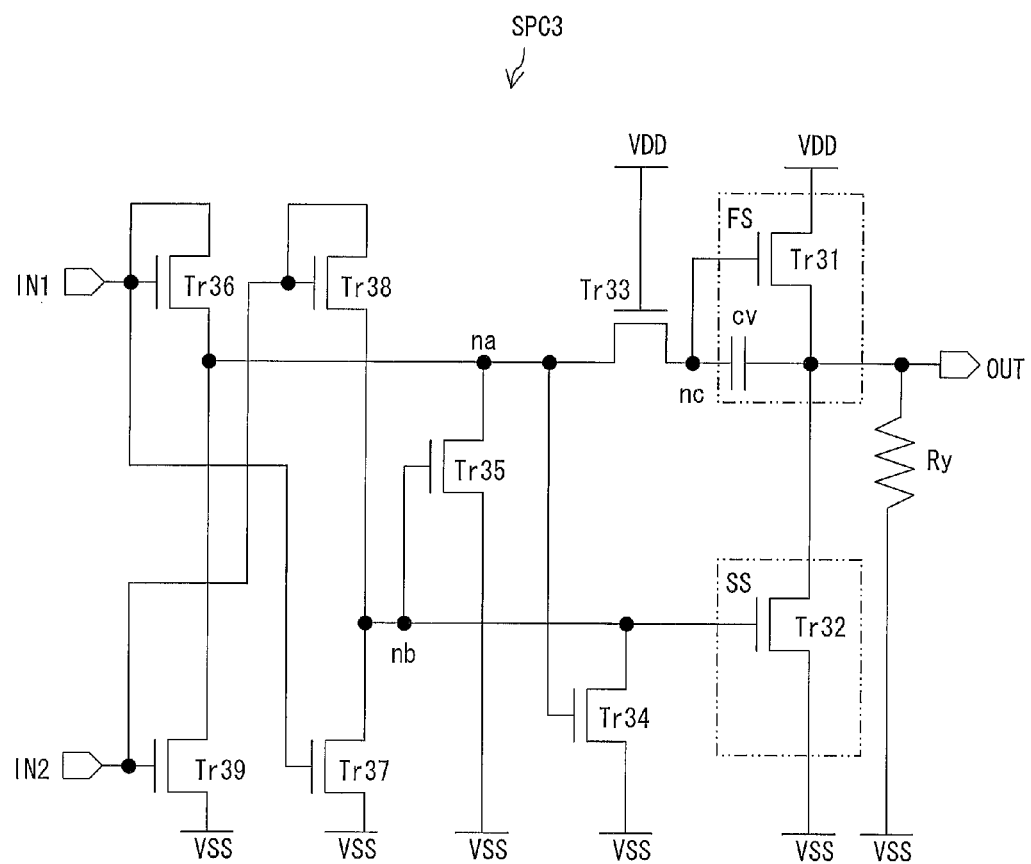
FIG. 10 is a view illustrating further another modified example of the signal processing circuit illustrated in FIG. 1.

Note that it is also possible to constitute a signal processing circuit SPC1 illustrated in FIG. 8 by causing the signal processing circuit SPC illustrated in FIG. 1 not to include the transistors Tr34 and Tr35. Further, it is also possible to constitute a signal processing circuit SPC2 illustrated in FIG. 9 by causing the signal processing circuit SPC illustrated in FIG. 1 not to include the transistor Tr33. Moreover, it is also possible to constitute a signal processing circuit SPC3 illustrated in FIG. 10 by causing the transistors Tr36 and Tr38 to be diode-connected to each other in the signal processing circuit SPC illustrated in FIG. 1.

Figure 11:
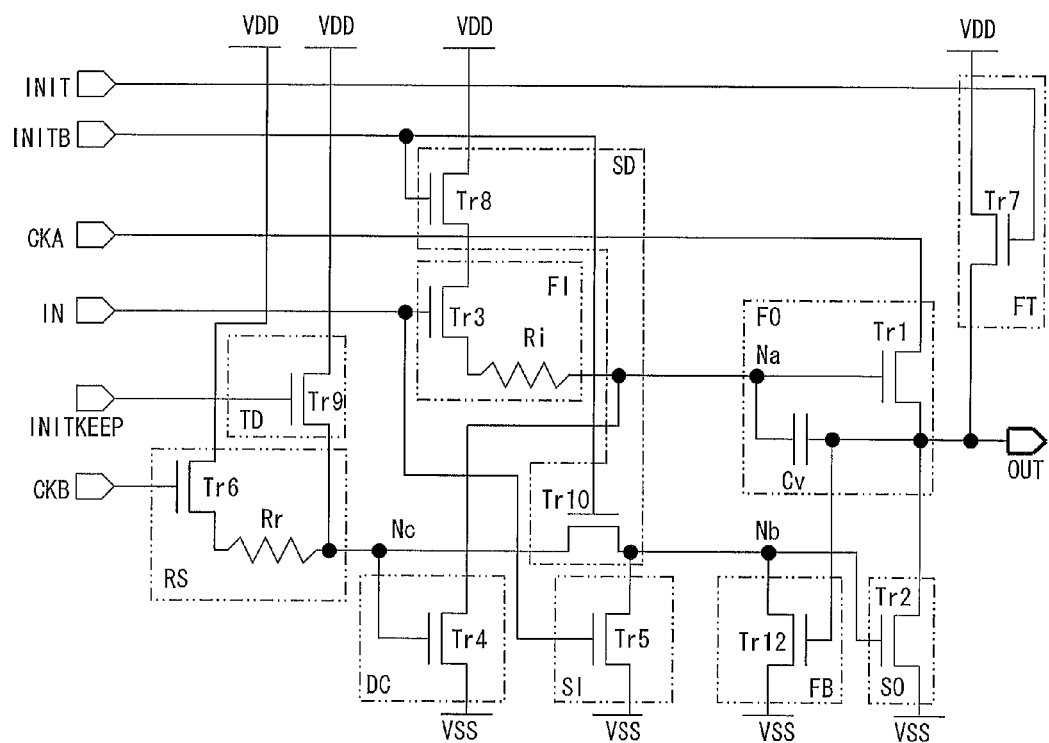
FIG. 11 is a view illustrating a modified example of the flip-flop illustrated in FIG. 2.

According to the flip-flop of the present invention, it is also possible to have an arrangement illustrated in FIG. 11 by causing the configuration illustrated in FIG. 2 not to include (i) the relay circuit RC and the malfunction preventing section SC (i.e., the transistors Tr13 through Tr15) and (ii) the Tr11 of a first initialization circuit FT. The following description deals with an all-on operation of the flip-flop illustrated in FIG. 11.

During an all-on time period, an INIT signal becomes active (High), an INITB signal becomes active (Low), and an INITKEEP signal becomes active (High). Accordingly, (i) a bootstrap capacitor Cv is discharged by a discharge section DC (this is because a Tr9 and a Tr4 are turned on, and a Tr1 is turned off), and a first output section FO becomes inactive, and simultaneously, (ii) a second output section SO becomes in the floating state (this is because a Tr10 is turned off). However, since a source electrode (OUT terminal) of the Tr1 of the first output section FO is connected to a VDD via a first initialization section FT, (i) the OUT terminal successfully receives a potential of VDD (High), irrespective of a CK1 signal and a CK2 signal, and simultaneously (ii) a node Nb becomes inactive (Low) by a Tr12, and, as a result, the second output section SO is turned off. Meanwhile, during a time period from a time that the all-on time period is finished to a time that a GSP signal becomes active, the INIT signal becomes inactive (Low), the INITB signal becomes inactive (High), and the INITKEEP signal becomes active (High). It follows that a Tr8 and the Tr10 are turned on, and the second output section SO becomes active (a Tr2 is turned on). Accordingly, the OUT terminal successfully receives a potential of VSS (Low), irrespective of the CK1 signal and the CK2 signal.

Figure 12:
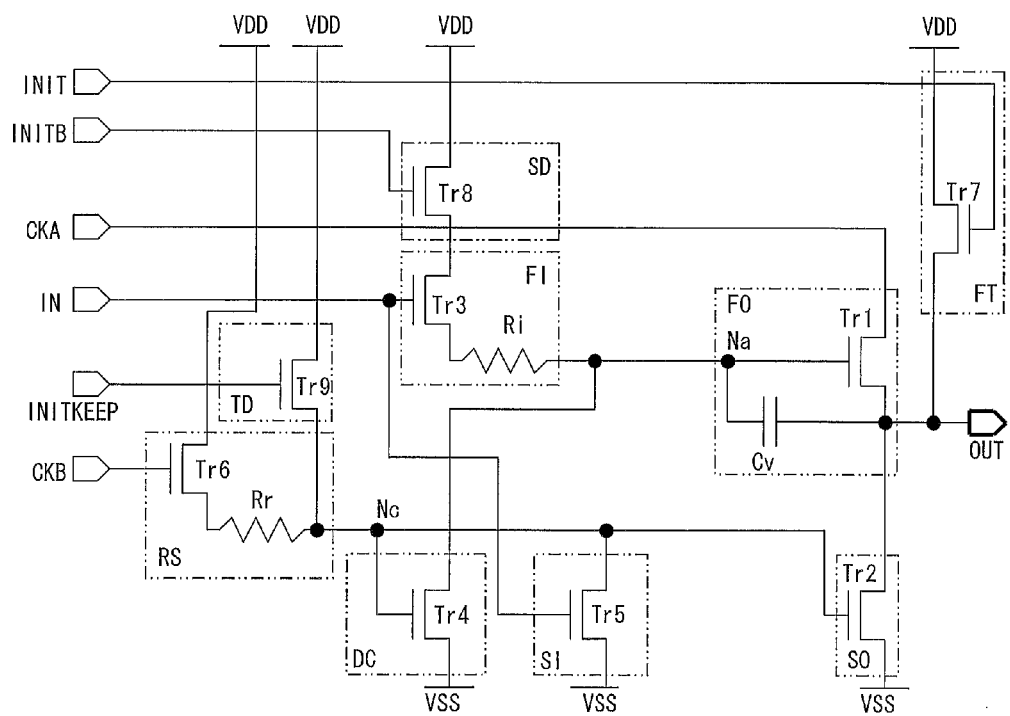
FIG. 12 is a view illustrating another modified example of the flip-flop illustrated in FIG. 2.
Figure 13:
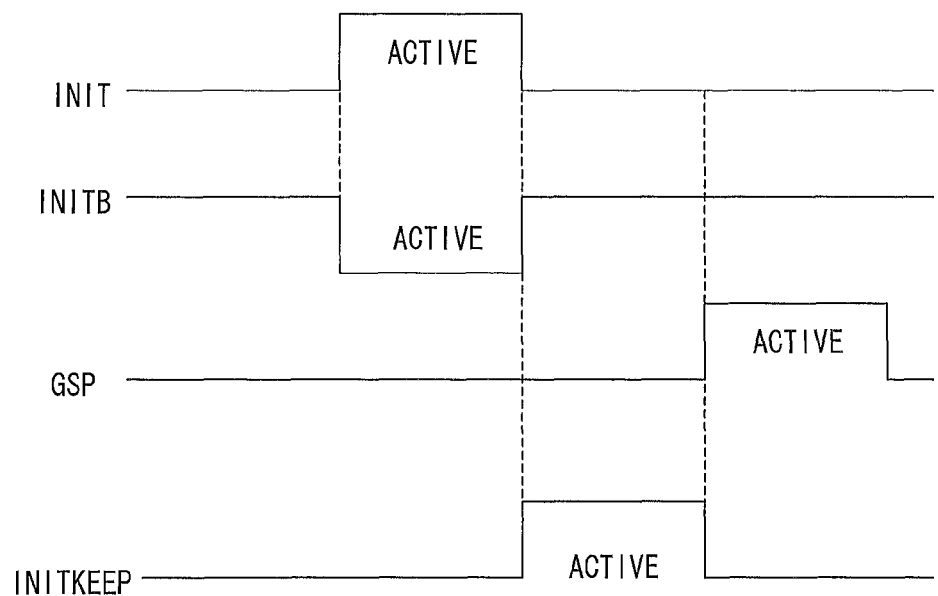
FIG. 13 is a timing chart showing a first initialization signal, a second initialization signal, and a third initialization signal, each of which is supplied to the flip-flop illustrated in FIG. 12.

According to the flip-flop of the present invention, it is possible to (I) have an arrangement illustrated in FIG. 12 by causing the configuration illustrated in FIG. 2 not to include (i) the relay circuit RC, the feedback section FB, and the malfunction preventing section SC (i.e., the translators Tr12 through Tr15) and (ii) the Tr11 of the first initialization circuit FT and the Tr10 of the first initialization circuit SD, and (II) supply, to the flip-flop illustrated in FIG. 12, an INIT signal, an INITB signal, and an INITKEEP signal, each being shown in FIG. 13. The following description deals with an all-on operation carried out with (i) the arrangement illustrated in FIG. 12 and (ii) the signals shown in FIG. 13.

During an all-on time period, the INIT signal becomes active (High), the INITB signal becomes active (Low), and the INITKEEP signal becomes inactive (Low). It follows that (i) a bootstrap capacitor Cv is discharged by a discharge section DC (this is because a Tr4 is turned on, and a Tr1 and a Tr8 are turned off), and, as a result, a first output section FO becomes inactive, and simultaneously (iii) a second output section SO becomes in an electrically-floating state (this is because a Tr5 and a Tr9 are in the off state). Accordingly, a source electrode (OUT terminal) of the Tr1 of the first output section FO is connected to a VDD via the first initialization section FT, and the OUT terminal therefore successfully receives a potential of VDD (High), irrespective of a CK1 signal and a CK2 signal. Simultaneously, the IN terminal becomes active (High) and the Tr5 is turned on because an IN terminal is connected to an OUT terminal of a flip-flop provided in another stage. It follows that the second output section SO is turned off. Meanwhile, during a time period from a time that the all-on time period is finished to a time that a GPS signal becomes active, the INIT signal becomes inactive (Low), the INITB signal becomes inactive (High), and the INITKEEP signal becomes active (High). It follows that the Tr9 is turned on and the second output section SO becomes active (a Tr2 is turned on). Accordingly, the OUT terminal successfully receives a potential of VSS (Low), irrespective of the CK1 signal and the CK2 signal.

Figure 14:
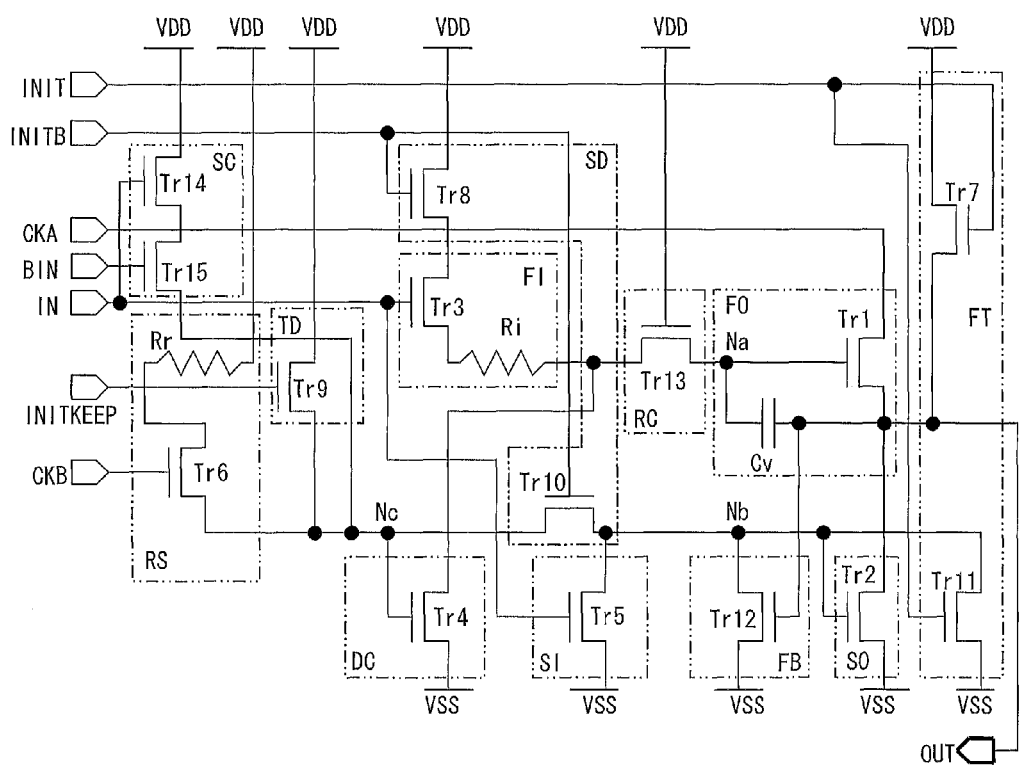
FIG. 14 is a view illustrating further another modified example of the flip-flop illustrated in FIG. 1.

The flip-flop illustrated in FIG. 2 has an arrangement in which the third node Nc is connected to the VDD via the resistor Rr of the reset circuit RS and the Tr6 of the reset circuit RS so that the resistor Rr is provided on the third node Nc side, and the Tr6 is provided on a VDD side. Note, however, that the present invention is not limited to this. The third node Nc can be connected to the VDD via the Tr6 and the resistor Rr, as illustrated in FIG. 14 so that the Tr6 is provided on the third node Nc side, and the Rr is provided on the VDD side.

Figure 15:
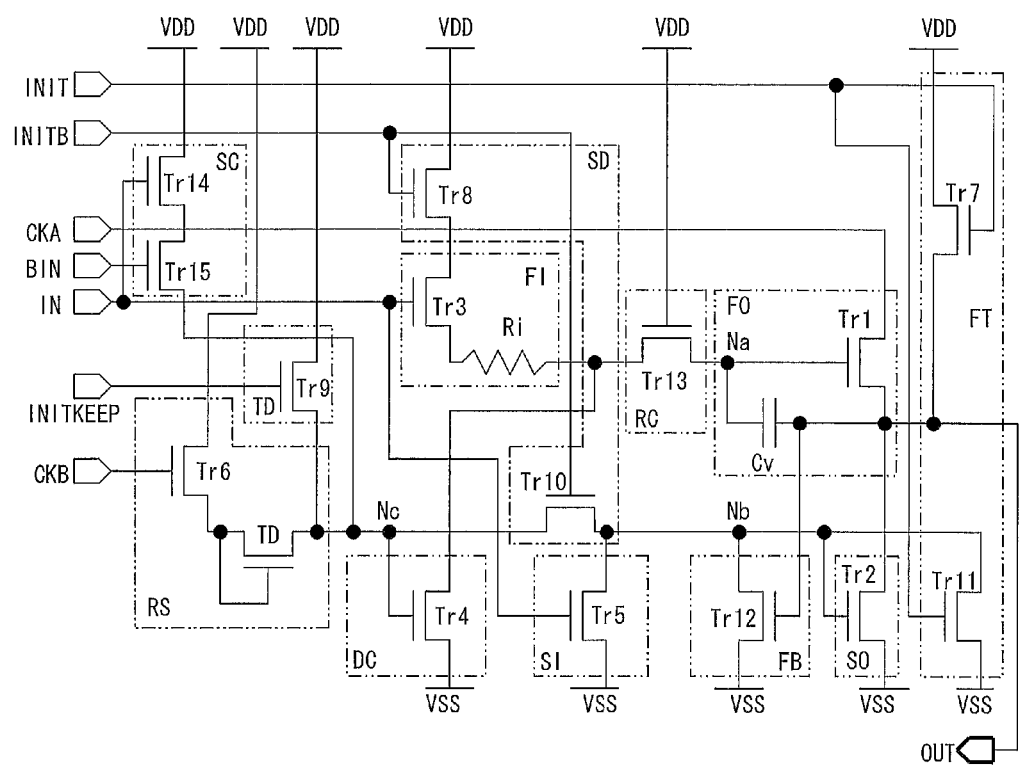
FIG. 15 is a view illustrating further another modified example of the flip-flop illustrated in FIG. 1.

The flip-flop illustrated in FIG. 2 has an arrangement in which the reset circuit RS includes the resistor Rr. Note, however, that the present invention is not limited to this. It is possible to have an arrangement in which the resistor Rr is replaced with a diode-connected transistor TD, as illustrated in FIG. 15.

Figure 16:
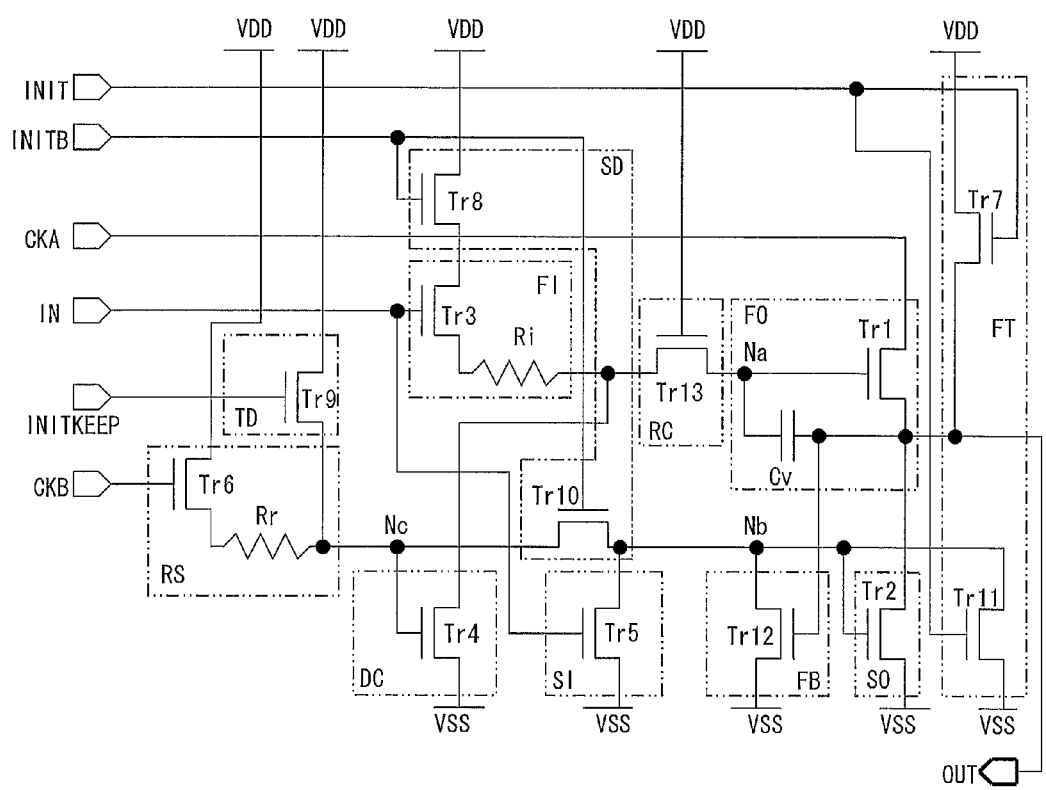
FIG. 16 is a view illustrating further another modified example of the flip-flop illustrated in FIG. 1.
Figure 17:
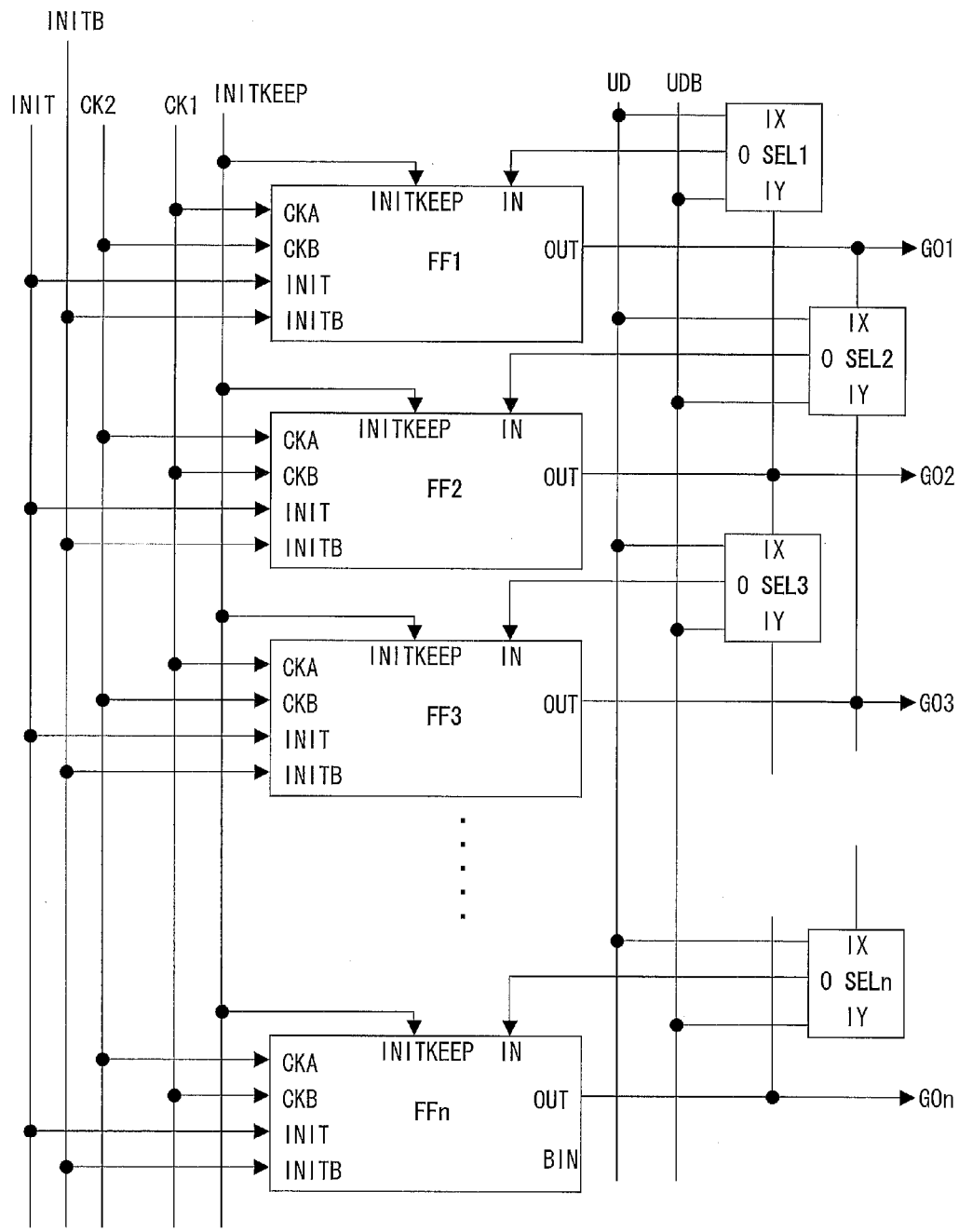
FIG. 17 is a circuit diagram illustrating a configuration example of a shift register (bi-directional shift register) including the flip-flop illustrated in FIG. 15.
Figure 18:
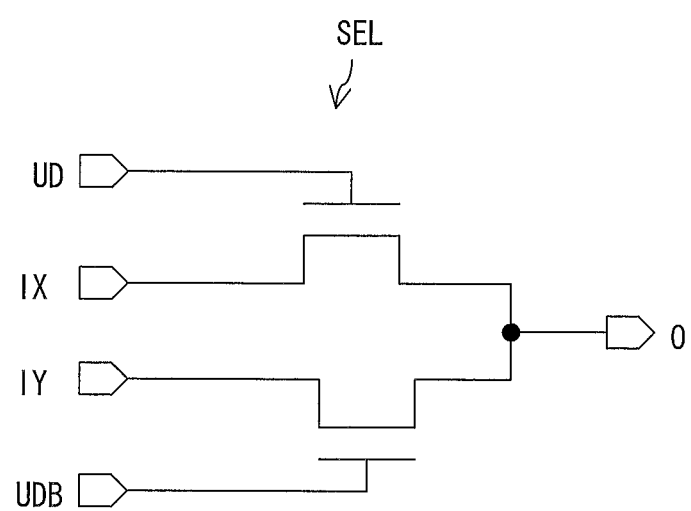
FIG. 18 is a view illustrating an example of a shift direction determining circuit used in the shift register illustrated in FIG. 16.
Figure 19:
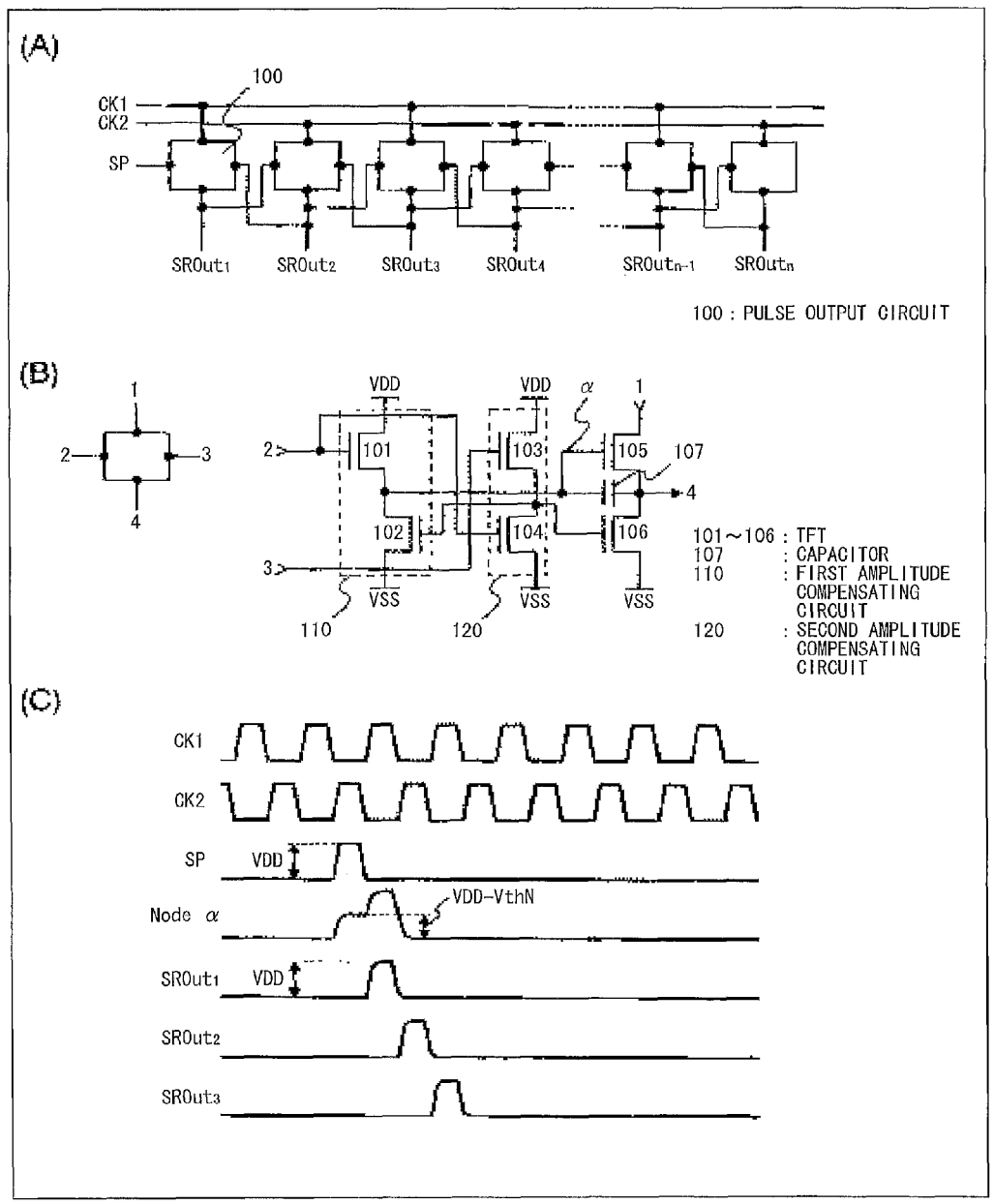
FIG. 19 is a view illustrating a configuration of a conventional signal processing circuit.

Further, it is possible to have an arrangement illustrated in FIG. 16 by causing the configuration illustrated in FIG. 2 not to include the malfunction preventing section only. Moreover, it is possible to constitute a shift register illustrated in FIG. 17, which shift register can carry out bi-directional shifting by using the flip-flops of the present invention (e.g., the flip-flops each being illustrated in FIG. 16). In this case, a shift direction determining circuit SEL is provided between adjacent ones of a plurality of stages, and a UD signal and a UDB signal are supplied to the shift direction determining circuit SEL. In a case where the shifting is carried out in a forward direction (downward direction), an SEL2 causes an OUT terminal of an FF1 and an IN terminal of an FF2 to be electrically connected to each other, for example. On the other hand, in a case where the shifting is carried out in a backward direction (upward direction), an SEL1 causes an OUT terminal of the FF2 and an IN terminal of the FF1 to be electrically connected to each other, for example. The shift direction determining circuit SEL includes two N-channel transistors (see FIG. 18). One of the two N-channel transistors is such that (i) its gate terminal is connected to a UD terminal, and (ii) its source electrode and its drain electrode are connected to an IX terminal and an O terminal, respectively. The other one of the two N-channel transistors is such that (i) its gate terminal is connected to a UDB terminal and (ii) its source electrode and its drain electrode are connected to an IY terminal and the O terminal, respectively.

As described above, a signal processing circuit of the present invention includes a first input terminal; a second input terminal; a third input terminal; a first node; a second node; an output terminal; a resistor; a first signal generating section which (i) is connected to the first node, the third input terminal, and the output terminal and (ii) includes a bootstrap capacitor; and a second signal generating section which is connected to the second node, a first power supply (a power supply corresponding to a potential of the input terminal which is inactive), and the output terminal, the first node becoming active in a case where the first input terminal becomes active, the second node becoming active in a case where the second input terminal becomes active, the output terminal being connected to the first power supply via the resistor.

According to the signal processing circuit of the present invention, the output terminal is connected to the first power supply via the resistor. For this reason, the output terminal does not become in an electrically-floating state even in a case where the first node and the second node become inactive. Accordingly, it is possible for the signal processing circuit to have an improvement in operational stability.

The signal processing circuit of the present invention can be arranged such that the third input terminal is connected to a second power supply (a power supply corresponding to a potential of the input terminal which is active).

The signal processing circuit of the present invention can be arranged such that the first signal generating section includes such a first transistor that (i) one of its conductive electrodes is connected to the third input terminal and (ii) the other one of its conductive electrodes is connected to (a) its control terminal via the bootstrap capacitor and (ii) the output terminal; and the second signal generating section includes such a second transistor that (I) its control terminal is connected to the second node, (II) one of its conductive electrodes is connected to the first transistor, and (III) the other one of conductive electrodes is connected to the first power supply.

The signal processing circuit of the present invention can further include a third transistor, the first node and the bootstrap capacitor being connected to each other via the third transistor.

The signal processing circuit of the present invention can further include a fourth transistor whose control terminal is connected to the first node; and a fifth transistor whose control terminal is connected to the second node, the first node being connected to the second power supply via the fifth transistor, the second node being connected to the second power supply via the fourth transistor.

The signal processing circuit of the present invention can be arranged such that the first transistor, the second transistor, the third transistor, the fourth transistor, and the fifth transistor are identical with each other in conductivity type.

The signal processing circuit of the present invention can be arranged such that the first signal generating section includes a first transistor; and the bootstrap capacitor is a parasitic capacitor of the first transistor.

A driver circuit of the present invention includes the signal processing circuit described above; and a shift register.

The driver circuit of the present invention can be arranged such that signals supplied to the first input terminal of the signal processing circuit and the second input terminal of the signal processing circuit, respectively, are set so as to be inactive at timing that the driver circuit is initially started to be in operation.

The driver circuit of the present invention can be arranged such that the first input terminal of the signal processing circuit receives a signal which is supplied to all stages of the shift register in common; the second input terminal of the signal processing circuit receives a signal which is supplied to a predetermined stage(s) of the shift register; and a signal obtained from the output terminal of the signal processing circuit is supplied to all of the stages of the shift register.

The driver circuit of the present invention can be arranged such that the shift register includes a flip-flop in each of the stages of the shift register; the flip-flop includes (i) a first output section which (a) includes a bootstrap capacitor and (b) is connected to a first clock signal terminal, (ii) a second output section which is connected to the first power supply, (iii) a first input section which charges the bootstrap capacitor, (iv) a discharge section which discharges the bootstrap capacitor, (v) a second input section which is connected to the second output section, and (vi) a reset section which (a) is connected to a second clock signal terminal and (b) controls the discharge section and the second output section; and the first output section is controlled by use of a first initialization signal; the first input section is controlled by use of a second initialization signal; the discharge section and the second output section are controlled by use of a third initialization signal; and the third initialization signal is obtained from the output terminal of the signal processing circuit in such a manner that (A) the first initialization signal is supplied to the first input terminal of the signal processing circuit and (B) a start pulse, which defines timing that the shift register starts carrying out shifting, is supplied to the second input terminal of the signal processing circuit.

The driver circuit of the present invention can be arranged such that the third initialization signal becomes active in synchronization with activation of the first initialization signal; and the third initialization signal becomes inactive in synchronization with activation of the start pulse.

A display device of the present invention includes the signal processing circuit described above.

The present invention is not limited to the description of the embodiments above, and embodiments of the present invention encompass (i) embodiments which are obtained by properly altering the foregoing embodiments in accordance with a well-known technique or a common technical knowledge and (ii) embodiments based on combinations of the foregoing embodiments. Further, effects and the like, described in the foregoing embodiments, are merely examples.

INDUSTRIAL APPLICABILITY

A signal processing circuit of the present invention is suitably used as, particularly, a driver circuit of a liquid crystal display device.

REFERENCE SIGNS LIST

SPC1-SOC4: Signal processing circuits
INIT: First initialization signal
INITB: Second initialization signal
INITKEEP: Third initialization signal
na-nc: Nodes
VDD: High-potential-side power supply
VSS: Low-potential-side power supply
Tr31-Tr35: First through fifth transistors

The invention claimed is:

1. A driver circuit, comprising:
a signal processing circuit, including:
    a first input terminal;
    a second input terminal;
    a third input terminal;
    a first node;
    a second node;
    an output terminal;
    a resistor;
    a first signal generating section which (i) is connected to the first node, the third input terminal, and the output terminal and (ii) includes a bootstrap capacitor; and
    a second signal generating section which is connected to the second node, a first power supply, and the output terminal; and
a shift register; wherein
the first node becomes active in a case where the first input terminal becomes active; the second node becomes active in a case where the second input terminal becomes active;
the output terminal is connected to the first power supply via the resistor;
the first input terminal of the signal processing circuit receives a signal which is supplied to all stages of the shift register in common;
the second input terminal of the signal processing circuit receives a signal which is supplied to a predetermined stage(s) of the shift register;
a signal obtained from the output terminal of the signal processing circuit is supplied to all of the stages of the shift register;
the shift register includes a flip-flop in each of the stages of the shift register;
the flip-flop includes (i) a first output section which (a) includes a bootstrap capacitor and (b) is connected to a first clock signal terminal, (ii) a second output section which is connected to the first power supply, (iii) a first input section which charges the bootstrap capacitor, (iv) a discharge section which discharges the bootstrap capacitor, (v) a second input section which is connected to the second output section, and (vi) a reset section which (a) is connected to a second clock signal terminal and (b) controls the discharge section and the second output section; and
the first output section is controlled by use of a first initialization signal;
the first input section is controlled by use of a second initialization signal;
the discharge section and the second output section are controlled by use of a third initialization signal; and
the third initialization signal is obtained from the output terminal of the signal processing circuit in such a manner that (A) the first initialization signal is supplied to the first input terminal of the signal processing circuit and (B) a start pulse, which defines timing that the shift register starts carrying out shifting, is supplied to the second input terminal of the signal processing circuit.

2. The drive circuit as set forth in claim 1, wherein:
the third initialization signal becomes active in synchronization with activation of the first initialization signal; and
the third initialization signal becomes inactive in synchronization with activation of the start pulse.

\* \* \* \* \*